United States Patent [19]
Hobden

[11] Patent Number: 5,463,357
[45] Date of Patent: Oct. 31, 1995

[54] WIDE-BAND MICROWAVE MODULATOR ARRANGEMENTS

[75] Inventor: Mervyn K. Hobden, Lincoln, United Kingdom

[73] Assignee: Plessey Semiconductors Limited, United Kingdom

[21] Appl. No.: 261,396

[22] Filed: Jun. 17, 1994

[30] Foreign Application Priority Data

Jul. 6, 1993 [GB] United Kingdom ............... 9313981

[51] Int. Cl.⁶ .................................. H03C 1/00; H03C 3/00
[52] U.S. Cl. ................... 332/151; 332/145; 332/159; 332/163; 455/102; 455/108; 455/111
[58] Field of Search ................... 332/149, 151–154, 332/159, 161, 163–166, 167–169, 144–148; 455/102, 108, 109, 110, 111, 112

[56] References Cited

U.S. PATENT DOCUMENTS

| | | | |
|---|---|---|---|
| 2,136,606 | 11/1938 | Bendel | 332/167 |
| 2,833,992 | 5/1958 | McKay et al. | 332/165 |
| 3,233,194 | 2/1966 | Alford | 332/170 X |
| 3,409,832 | 11/1968 | Kessel | 455/109 |
| 3,651,429 | 3/1972 | Ruthroff | 455/110 |
| 3,675,162 | 7/1972 | Owen et al. | 455/109 X |
| 3,755,754 | 8/1973 | Putz | 332/161 X |
| 3,778,718 | 12/1973 | Bass et al. | 455/110 X |
| 4,243,955 | 1/1981 | Daniel et al. | 455/109 X |
| 4,268,802 | 5/1981 | Fisher et al. | |
| 4,477,781 | 10/1984 | Reuss, Jr. | 330/286 |
| 4,660,222 | 4/1987 | Smith | 332/170 X |
| 5,065,340 | 11/1991 | Boria et al. | |
| 5,126,698 | 6/1992 | Fischer et al. | 455/110 X |

FOREIGN PATENT DOCUMENTS

| | | |
|---|---|---|
| 0529874 | 3/1993 | European Pat. Off. . |
| 1436359 | 5/1976 | United Kingdom . |
| 9323921 | 11/1993 | WIPO . |

Primary Examiner—David Mis
Attorney, Agent, or Firm—Kirschstein et al.

[57] ABSTRACT

A wide-band microwave modulator arrangement for an information transmission system, such as a video signal distribution system, in which signals from a microwave carrier signal source are split and directed over a first path comprising an attenuator and a second path comprising phase shift means and a balanced modulator, the output signals from the two paths being combined for transmission. Signals from the carrier signal source may also be directed over a third path including phase shift means and a second balanced modulator, amplified output signals from the first two paths being combined with output signals from this third path before transmission.

5 Claims, 6 Drawing Sheets

40GHz TRANSMITTER

DOUBLE SIDEBAND MODULATOR

Figure 3:
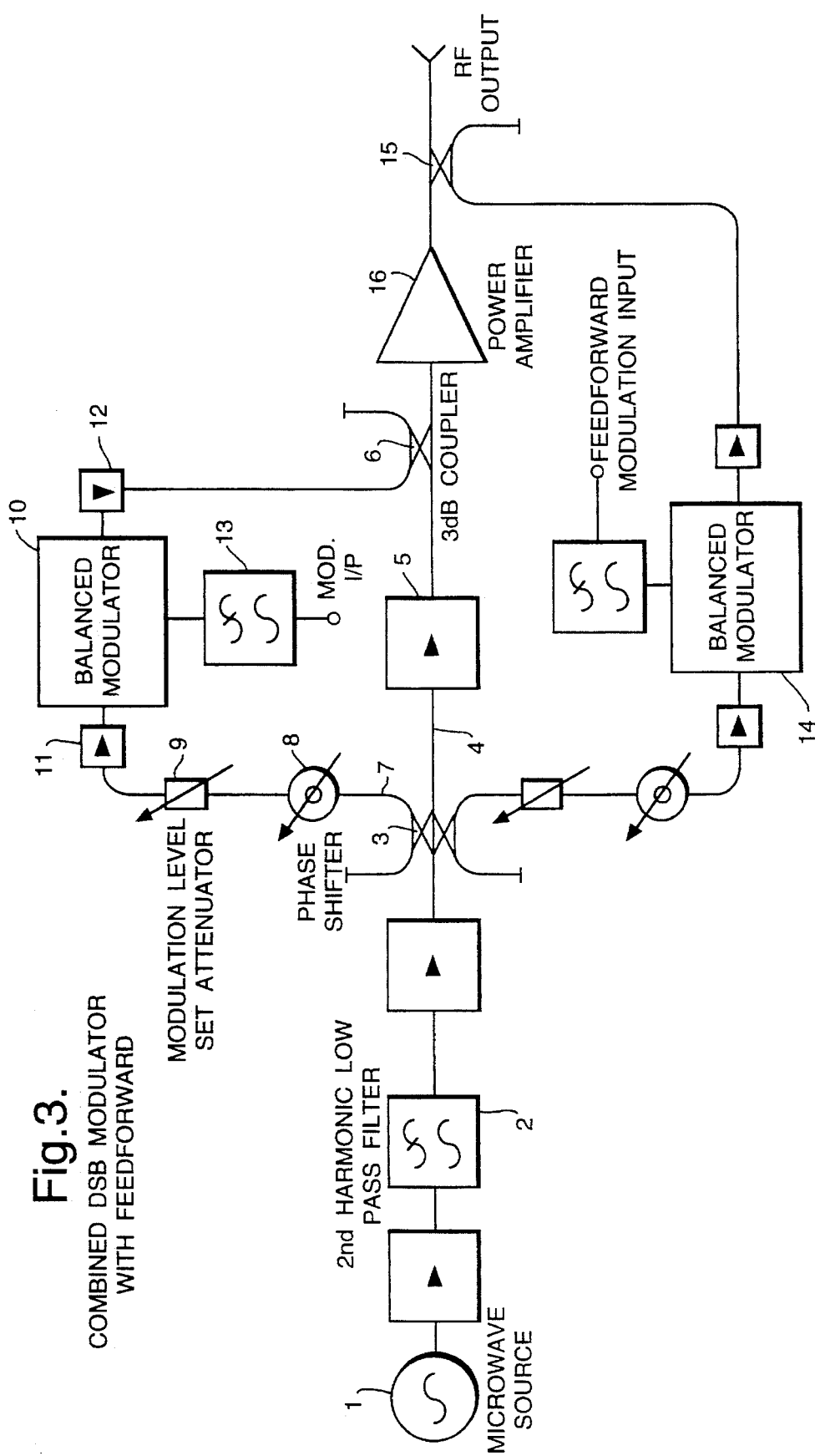

Fig.3. COMBINED DSB MODULATOR WITH FEEDFORWARD

SINGLE TRANSMITTER/RECEIVER-RANGE LOSS
PROPORTIONAL TO $1/R^2$

MULTIPLE TRANSMITTERS AT CONSTANT RANGE
TO A SINGLE RECEIVER-RECEIVED POWER IS
NO LONGER DEPENDENT ON EXACT $1/R^2$ LAW

WIDE-BAND MICROWAVE MODULATOR ARRANGEMENTS

The present invention relates to wide-band microwave modulator arrangements.

According to the present invention a wide-band microwave modulator arrangement comprises a microwave carrier signal source, means to direct signals from said source over a first path including attenuator means and over a second path including phase shift means and a balanced modulator arrangement to which wideband modulation signals are arranged to be supplied, and means to combine signals from the outputs of said first and second paths for transmission.

Figure 1:
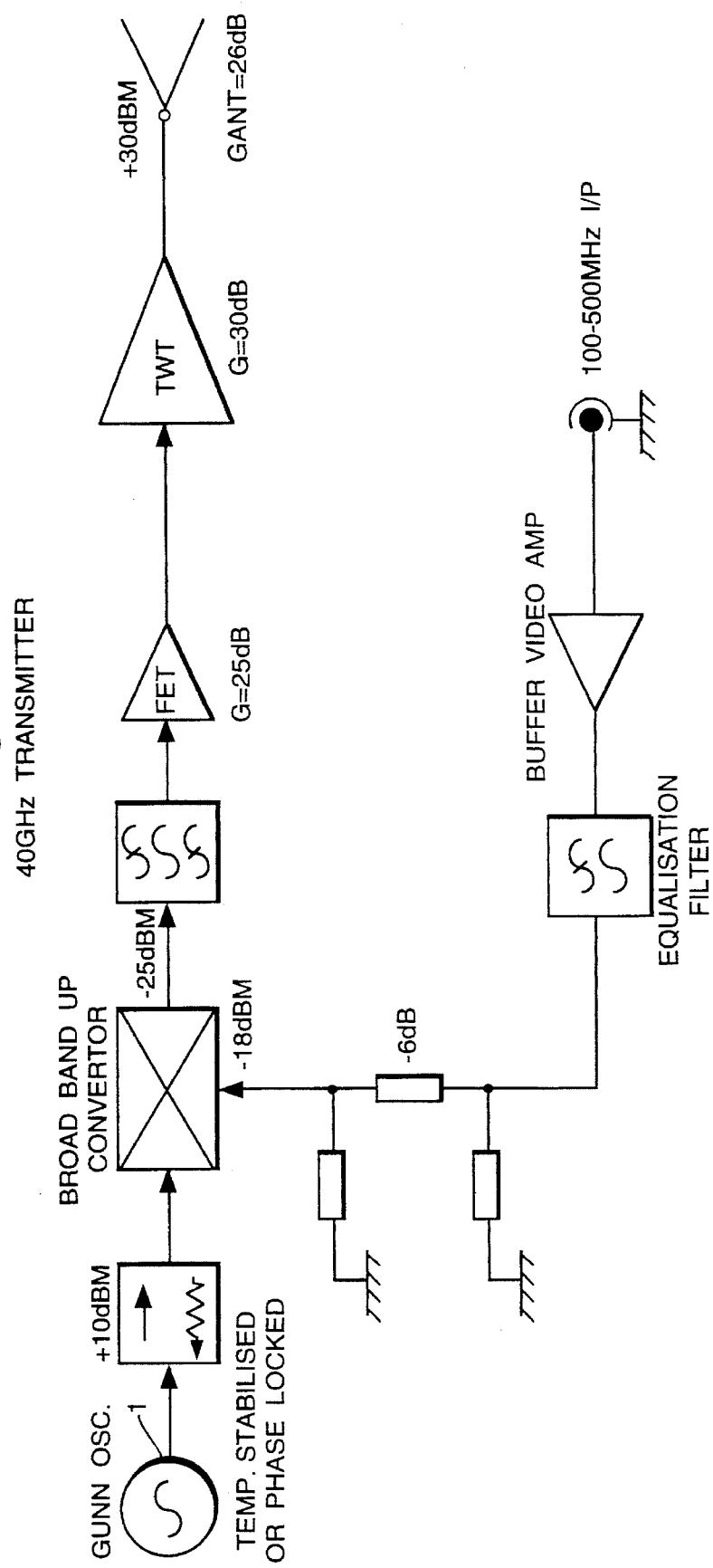
Figure 2:
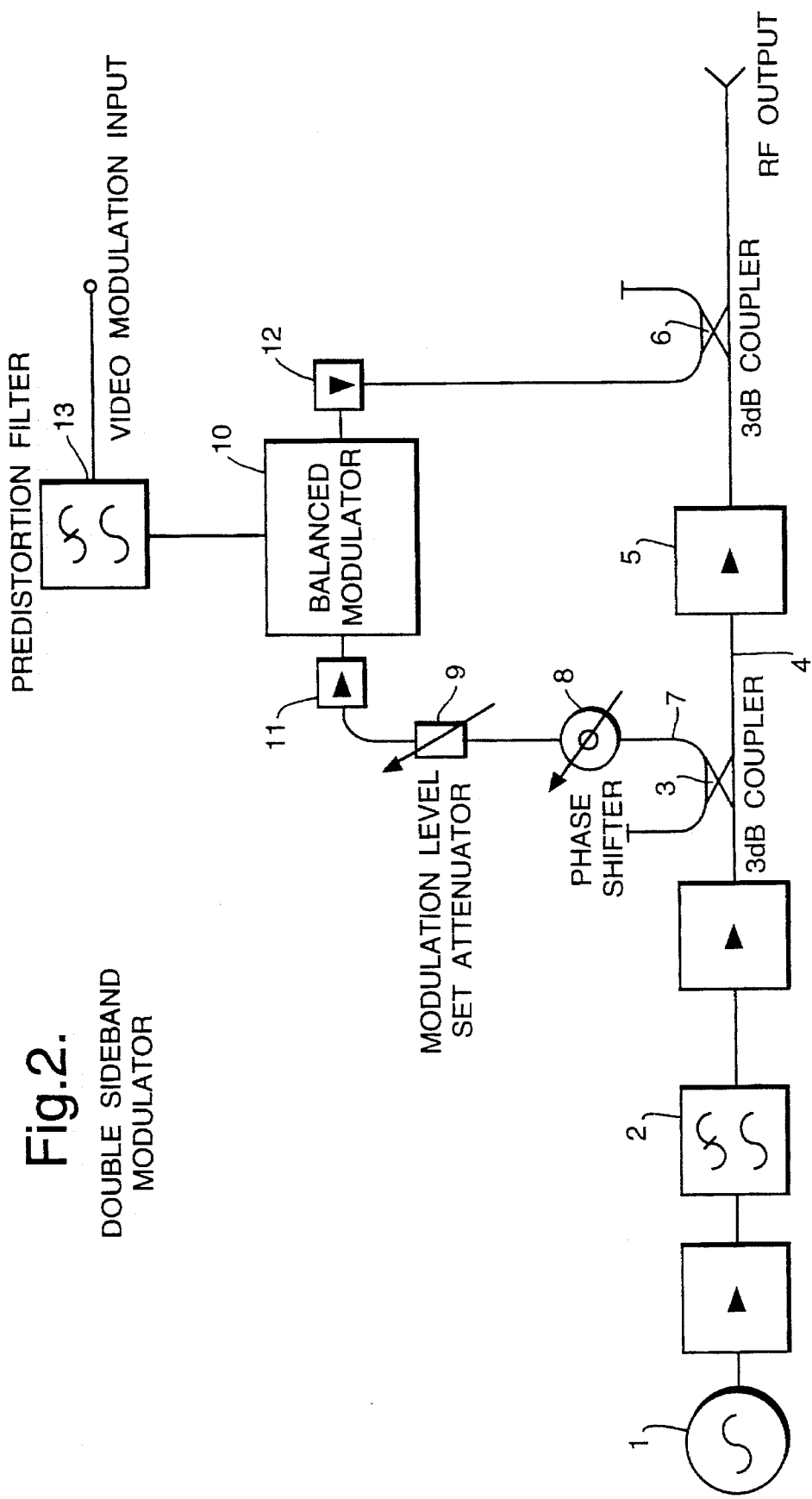
Figure 4:
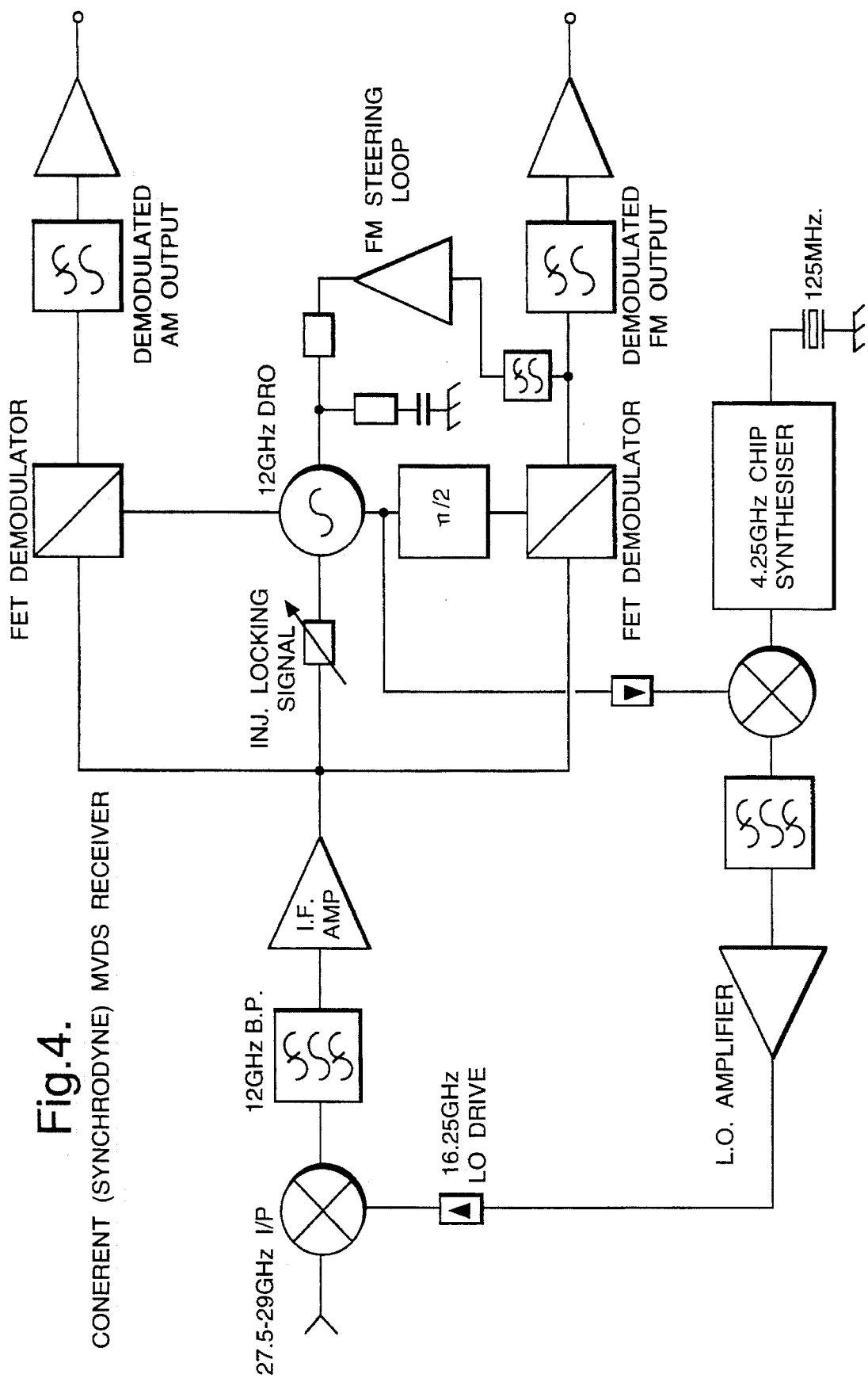
Figure 5:
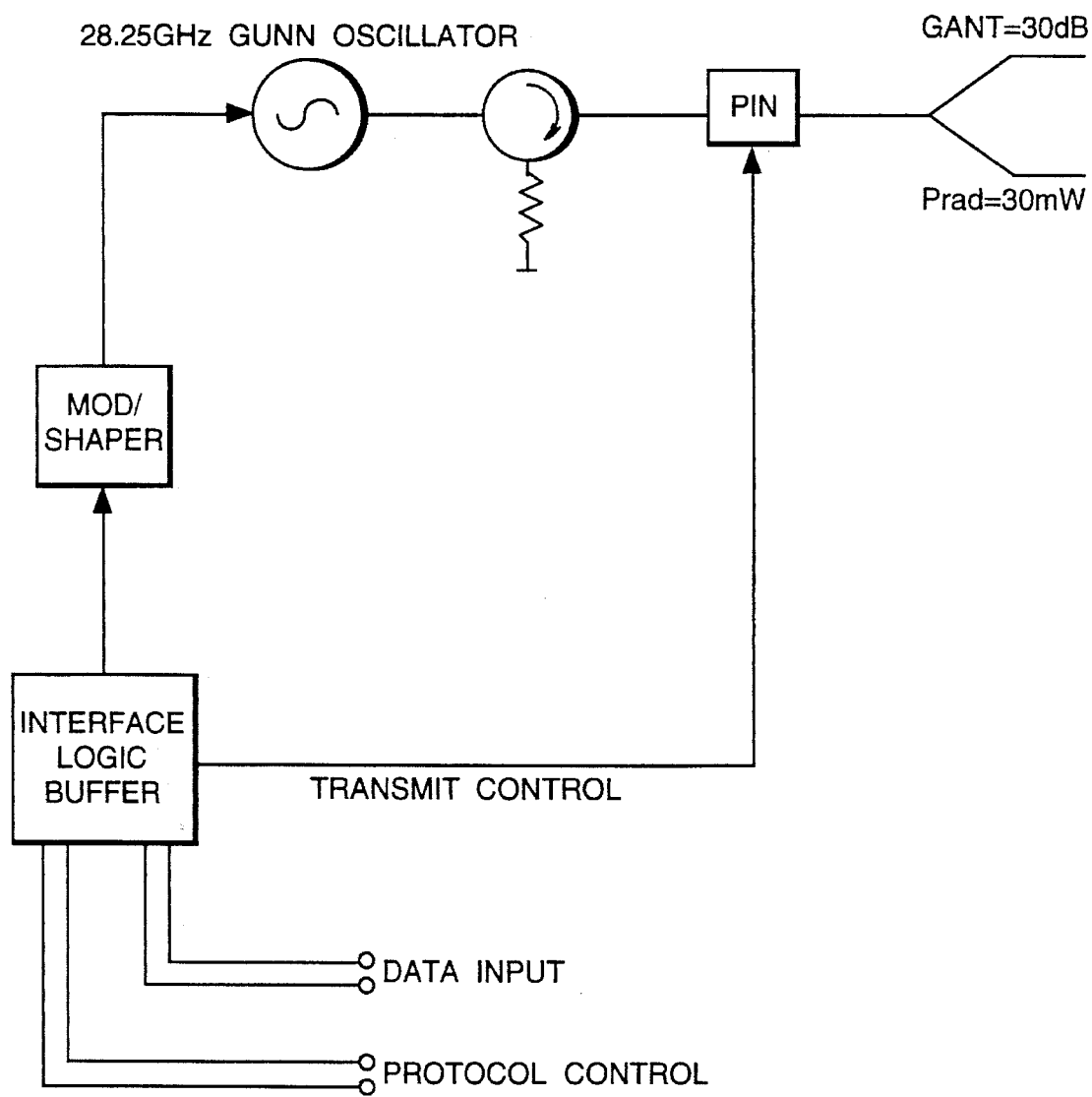
Figure 6:
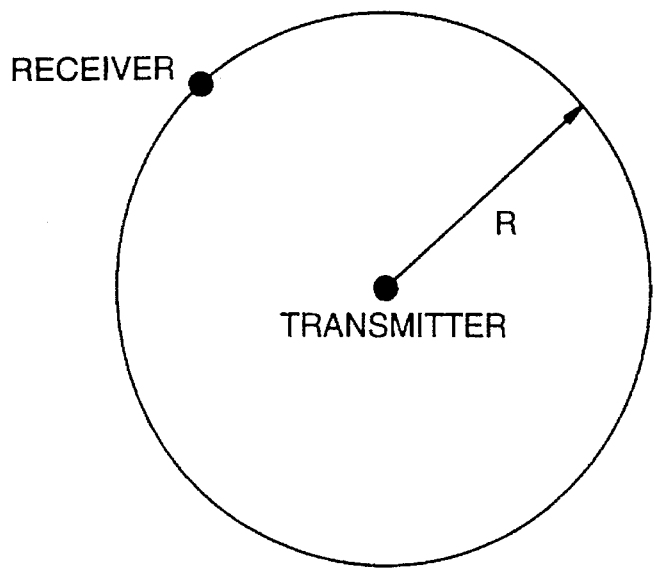
Figure 7:
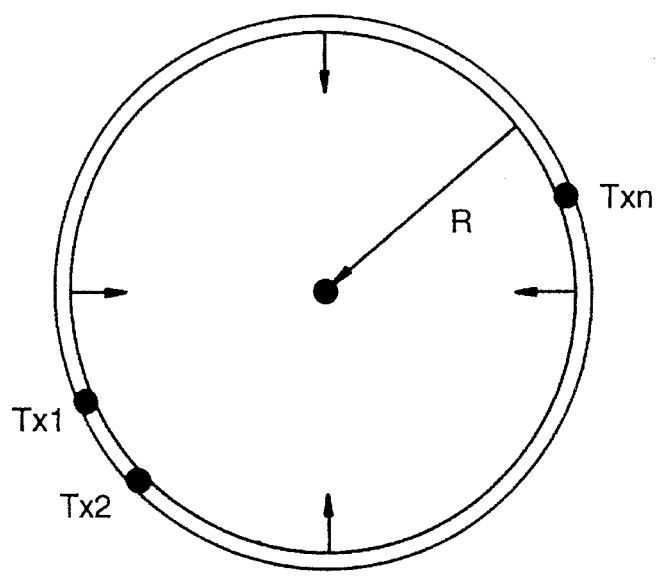

A video signal distribution system incorporating a wide-band microwave modulator arrangement in accordance with the present invention will now be described by way of example with reference to the accompanying drawings, of which:

FIG. 1 shows schematically a transmitter station of the system,

FIG. 2 shows schematically in more detail one form of the up convertor or modulator of FIG. 1, FIG. 3 shows schematically in more detail a second form of the up convertor or modulator of FIG. 1, FIG. 4 shows schematically a receiver station of the system, FIG. 5 shows schematically a return path transmitter of the system, and FIGS. 6 and 7 illustrate diagrammatically range/loss characteristics of the system.

Referring first to FIG. 1, the first part of the transmitter consists of a source 1 of millimeter wave power sufficient to drive the modulator/upconverter. This may be a stabilised GUNN oscillator, synthesised source or any convenient method known to the art with stability and spectral purity adequate for the application. The source is to be provided with an electronic tuning port capable of frequency shift modulation up to the rate necessary for the return path application. The output of the source is taken via a low pass filter 2 (FIG. 2) to limit the level of even order harmonics of the source frequency applied to the modulator.

The modulator is shown in FIG. 2. The input signal is split into two paths by means of a −3 dB, 180° hybrid coupler 3. The carrier reference path 4 is fed via a microwave isolator 5 to the input port of a second reversed −3 dB, 180° coupler 6. The modulation path 7 takes the output from the second port of the coupler 3 and feeds this signal via a phase shifter 8 and a level set attenuator 9 to the balanced modulator 10. The modulator match is isolated from the modulation path 7 by means of microwave isolators 11 and 12 on its input and output ports. The modulation port of the modulator 10 is fed with the desired amplitude modulated intelligence at the same frequency and channel spacing as that of the cable video signal by way of a filter 13. The action of the modulator is to impose amplitude modulation of the microwave carrier at the modulation rates of the complete band of cable video signals. To provide high linearity of modulation across the working bandwidth both the amplitude and phase of the superimposed modulation may be adjusted by means of the level set attenuator 9 and the phase shifter 8 in the modulation path 7. By this means the superposed modulation may be adjusted so as to exactly represent pure amplitude modulation across the working bandwidth of the modulator. Furthermore, if the input signal to the modulator 10 be predistorted in both amplitude and phase so as to compensate for the inherent residual non-linearity of the transmitting amplifier chain, then the modulator controls may be used to optimise the overall performance of the chain by means of the inherent capability of the modulator to provide any combination of modulation between pure phase modulation and pure amplitude modulation. The modulator is therefore capable of introducing asymmetry into the spectrum $S(\omega)$ to compensate for the effects of the following system transfer function, $K(i\omega)$. If so desired, an additional modulator 14 may be operated in parallel, as shown in FIG. 3, so as to provide feedforward of a proportion of the modulated carrier to be summed with the output at a suitable point 15 in the system so as to provide additional compensation of non-linearity.

The output of the modulator 10 is fed via a band limiting filter to a linear amplifier chain 16 with sufficient gain to raise the output power to the desired transmission level. The amplifier chain may comprise of any suitable type available, solid state or thermionic, providing that the amplitude and phase linearty is sufficiently good to provide negligible levels of distortion of the applied signal. The level of composite triple beats between individual channels of the applied signal should be −56 dB. with respect to the peak carrier power in the transmitter.

The output of the amplifier chain 16 is fed via a microwave isolator (not shown) to the transmitting antenna. The antenna type is dependant on application and will provide for the desired polarisation of the transmitted wave, preferably circular polarisation. Circular polarisation is chosen to eliminate the effects of multipath reception in the receiver causing ghosting on the demodulated video signal. The reception of transmitted energy via two or more paths of different lengths, due to reflection and re-radiation, leads to interfering signals in the receiver whose phase differs from that of the energy received via the direct path. Where the system is used for area distribution it will be impossible to avoid the reflection and re-radiation of some energy due to the existence of buildings and other structures within the antenna radiation pattern. The use of a high gain antenna for the receiver system only provides partial reduction of the effect as the antenna sidelobes have finite gain. Furthermore, antenna gain and therefore beamwidth, is limited by engineering costs. If a circular polarised wave is reflected from an arbitrary scatterer, the reflected wave is of opposite rotation to the original transmitted wave. This provides an additional −30 dB. of isolation from the first reflected wave. Under conditions of precipitation, such as fog or rain, the water droplets in the atmosphere form spherical reflectors capable of producing severe multi-path scattering, due to continual re-reflection and the effects of variable electrical permittivity along the link path. Circular polarisation consists of the vectoral rotation of both E and H fields in a direction and radial velocity set by the geometry of the transmitting antenna. The receiving antenna must exactly replicate the geometry of the transmitter so as to maximise the energy taken up from the rotating field. All other polarisations, differing in geometry, radial velocity and relative phase delay, are rejected in some degree by the receiving antenna system. Maximum rejection is achieved for waves of opposite radial velocity or fixed polarisation where the field components are antiphase to the standing wave on the receiving antenna. Where the antenna is immersed in a radiated field a proportion of whose energy is of the correct polarisation for that antenna and the rest consists of arbitrary and random polarisation, the antenna acts as a polarisation filter, rejecting those components whose phase and amplitude do not reinforce the average wave on the antenna.

The system provides the facility for the use of a return path using orthogonal complex modulation. In this application, both frequency modulation and amplitude modulation are superimposed on the carrier radiated by the main transmitter. The use of double sideband amplitude modulation for the video frequency channels means that the transmitter phase and amplitude linearity has to be strictly controlled over the full working bandwidth. In the case of amplitude modulation, both the amplitudes and phases of the upper and lower sidebands with respect to the carrier amplitude and phase are identical. In the case of pure phase modulation, the amplitudes of the upper and lower sidebands are identical and the phases differ by 180°. Therefore, if a detector sensitive only to envelope amplitude variation and a detector sensitive only to phase variation of the carrier are used with a carrier carrying both forms of modulation intelligence and the system linearity is such that no cross modulation of AM to PM or PM to AM terms occurs, both forms of modulation may be used without interference. The modulation rate and modulation index of the frequency modulation must be set so that higher order products of the frequency modulated wave do not fall into the AM video frequency baseband. This limits the deviation and modulation rate of the FM signal to sideband levels not exceeding −26 dBc at modulation rates up to 50 kBaud. To limit the production of higher order sidebands and to maximise dynamic range, matched filters are used at the transmitter and the receiver for the frequency modulated signal. The difference between the bandwidth of the receiver FM intermediate frequency amplifier and the AM intermediate frequency amplifier corresponds to 21 dB improvement in signal to noise ratio. This is sufficient to compensate for the lower level of intelligence modulated on the FM channel out to the maximum working range of the transmitter.

Frequency modulation is applied to the source by the use of a direct electronic tuning port in the preferred application. Modulation can also be applied via a synthesised source if so desired by means of direct or indirect modulation of the reference frequency or the upconversion of the frequency modulated carrier onto a subcarrier within the synthesis loop.

The main receiver is shown in FIG. 4. The signals are received by the antenna whose gain is chosen according to the application and which provides for the depolarisation of the circular polarised wave back to a TEM wave on transmission line to feed the receiver mixer. For applications where the receiver is operated in conditions of high signal strength, a variable pad attenuator is incorporated between the antenna and the mixer port. A single superheterodyne is used to downconvert the received signal to an intermediate frequency commensurate with the bandwidth requirements of the complete signal. The output of the intermediate frequency amplifier is fed to a synchrodyne demodulator using an injection locked Dielectric Resonator Oscillator (DRO) the output of the DRO being phase coherent with the carrier of the double sideband signal to within ±20°. The output of the DRO is fed to two synchronous demodulators, using high level FET mixer technology. One channel is fed in phase with the IF signal, to provide AM demodulation. The other is fed through a 90° phase shifter, to provide demodulation of the FM close to carrier signal and may also be used, in conjunction with a frequency lock loop, to provide a frequency steering voltage to a varactor on the DRO. This will allow the demodulator oscillator to be aligned with signals outside its injection locking bandwidth, at which point, injection locking and phase alignment will occur. The combination of the narrow bandwidth (high quality factor or 'Q') of the oscillator resonator and the use of amplitude limitation of the fundamental IF frequency fed to the locking port of the DRO, serve to strip off the modulation sidebands of the IF signal, to leave a clean carrier reference for the demodulators.

Both upper and lower sidebands are detected and summed then passed through a low pass filter to produce the cable video signal as originally modulated onto the carrier at the transmitter. This signal, after suitable amplification and buffering is directly distributed into the cable network. The amplitude of the signal at the detector is monitored by an automatic gain control system which adjusts the gain of the intermediate frequency amplifier to ensure that the detector is operated with a signal input sufficient to maintain the synchronous detector in its most linear region of operation.

The frequency demodulation channel output is fed to a low pass filter and video amplifier. The demodulated digital signal is amplified and buffered before feeding to the microprocessor controller for that section of the cable network.

To provide a method whereby the first local oscillator provides the correct frequency input to the first mixer, an output is taken from the DRO at 12 GHz and mixed with the signal from a 4.25 GHz offset synthesis loop. The upper sideband output of this mixer is taken, via a bandpass filter and amplified to the correct power level for the local oscillator port of the first mixer. Thus, any movement of the signal in the IF passband is compensated, firstly by the movement of the 12 GHz oscillator towards the direction of the frequency shift and secondly by the movement of the effective IF frequency in the direction necessary to counter the shift. This effectively doubles the available tuning range for a given oscillator deviation, making the best possible useage of the available injection locking bandwidth.

To allow the system to provide information regarding the use by subscribers of the cable video signal, a return path transmitter is integrated into each main receiver site. The transmitter is shown in FIG. 5. A simple frequency modulated GUNN oscillator source is integrated into an E-plane waveguide structure containing a microwave reflective PIN attenuator and isolators. The output of the E-plane waveguide structure containing a microwave reflective PIN attenuator and isolators. The output of the E-plane waveguide is fed to a high gain antenna whose bore sight is aligned back to the main transmitting site. The GUNN oscillator is thermally stabilised by means of an integrated temperature controlled heater to reduce thermally induced frequency drift. In normal operation, the GUNN oscillator runs continuously with the PIN attenuator in the OFF state, providing −26 dB of isolation of the output signal. As the power output of the GUNN oscillator at the antenna is of the order of +16 dBm, then radiated power in this state is circa −11 dBm. This power level is insufficient to activate the receiver at the main transmitter site or to give substantial leakage into the main receiver via the antenna sidelobes. The frequency of operation of the return path system is chosen so as to fall outside the working bandwidth of the cable video modulation on the main transmitted carrier. The receiver at the main transmitter site is tuned so as to be sensitive to the return path transmission only. Interrogation signals are transmited from the main transmitter using the narrow band digital frequency modulation capability of the microwave source. These suitably coded signals are picked up by the main receivers at each remote site and are demodulated and fed to the microprocessor controller at that location. If the decoded signal is recognised by the controller, then the return path transmitter is energised, the PIN attenuation is reduced to minimum and a handshaking sequence is transmitted back to the main site. The main site controller can now exchange information with the remote receiver site, each message being subject to a handshaking protocol. As each message contains an identification sequence that completely identifies the context of the following information, then the main site can multiplex messages or instructions to make the best possible use of the available transmit time on the return path loop.

The system as above delineated is designed to make the best possible use of the double sideband band signal in providing frequency and space diversity. As is well known in the application of FM systems for area distribution, multiple sources and antennas lead to no-capture areas in which the received signals at a given point are severely distorted due to multipath beats. This phenomenon may be avoided by the use of spread spectrum techniques where sufficient frequency diversity is applied to ensure that a reasonably phase coherent signal is always present at the receiver. Such techniques, which involve rapidly switching the transmitter output frequency, are not applicable to cable video signals where the effective signal modulation rates can exceed 500 MHz. However, a double sideband signal provides, where the modulation rate is substantial, a degree of frequency diversity in real time. The upper and lower sidebands in amplitude modulation, are in phase with each other and the carrier frequency. Therefore, if the subcarrier groups, carried as amplitude modulation are sufficiently spaced either side of the carrier, the process of demodulation compensates for frequency dependant amplitude and phase changes along the transmission path.

If this is combined with spatial diversity at the transmitter antennas, then the resultant system is largely immune to the effects of non-capture within its area of application due to beats produced by path length differences. Where a large area must be served, more than one transmitter must be used to ensure full coverage. To arrange that all the transmitters within the service area have no sensible overlap in their radiation patterns or are completely synchronised in such a way as to compensate for path length differences is impractical and results in a high degree of system redundancy and extra cost.

A further effect that is alleviated by the above system is that of varying path length phase and amplitude change due to changing atmospheric conditions due to water vapour, pressure and temperature. These have a marked effect on phase delay, in particular at the microwave frequencies used in this system, producing time variant modulation of both chrominance and level signals in a frequency modulated system. Providing that phase delay equalisation in the modulation frequency band is used for the modulation applied to each transmitter in the network then the amplitude modulated system is not affected by path length changes in electrical permittivity.

As the above system has been designed to allow the reception of multiple transmitted signals at a single receiver without the production of significant levels of intermodulation due to path length delay; this capability may be used to overcome the accepted inverse square-law losses from a single radiating transmitter and single receptor.

FIG. 6 shows the accepted picture of the spherical geometry associated with an isotropic source and a single receiver. As the transmitter is assumed to transmit equal energy to all portions of the surrounding spherical surface, then the decrease in energy received at a single point receiver on that surface, at a given distance R, corresponds to the ratio between the fixed receptor area and the total area of the spherical surface. That is, from the given geometry, proportional to $1/R^2$.

Next, consider FIG. 7, where the transmitted energy, equal to that in the previous example, is distributed over a spherical surface at the same range R and radiates inwards to the single receptor at the centre of the spherical geometry. It is obvious that the inverse square law does not apply in this case of inverse spherical geometry and that the only losses associated in the integrated energy at the point receptor are those due to resistance losses in the transmission medium. It follows that any system of directed radiators, arranged so as to beam energy at a constant range to a single receptor, has an improvement in performance directly proportional to the increase in effective area of the total radiating surface. If the total radiating area can be made equal to the equivalent to the corresponding spherical surface at that range, by means of the sum of the antenna gains of all the source antennas, together with the receiver antenna gain, then the path length loss is purely resistive.

Any practical system that sums the received power at a point from multiple sources will outperform a single source system. The combination of multipaths in a cellular network, together with the concomitant equalisation of modulation phase at each transmitter, provides the optimal cellular solution.

For efficient functioning of the above system, the operational bandwidth of both the transmitter and the receiver must be large, to ensure that radio frequency phase distortion is kept to a minimum. The RF characteristics of all transmitters and receivers in the network must also be matched to ensure that phase ripple across the modulation bandwidth does not degrade the intermodulation performance of the system. However, this is in line with normal microwave system practise at these frequencies.

I claim:

1. A wide-band microwave modulator arrangement for an information signal transmission system, comprising: a microwave carrier signal source; means for directing microwave carrier frequency signals from said source over first and second paths; means for adjusting the relative phase and amplitude of the microwave carrier frequency signals in said first and second paths; balanced modulator means in one of said first and second paths; wide-band modulation input means for applying wide-band information signals to said balanced modulator means in predetermined amplitude and phase; and means for combining output signals from said first and second paths such as to reinsert a signal at said microwave carrier frequency into the output of said balanced modulator means.

2. The wide-band microwave modulator arrangement in accordance with claim 1, wherein the relative phase of the microwave carrier frequency signals in said first and second paths is adjusted such that said combined output signals represent pure double side-band amplitude modulated signals.

3. The wide-band microwave modulator arrangement in accordance with claim 1, wherein the relative phase of the microwave carrier frequency signals in said first and second paths is adjusted such that said combined output signals represent pure double side-band phase modulated signals.

4. The wide-band microwave modulator arrangement in accordance with claim 1; and further comprising means for directing microwave carrier frequency signals from said source over a third path; means in said third path for adjusting the phase and amplitude of the microwave carrier frequency signals in said third path; further balanced modulator means in said third path; further wide-band modulation input means for applying said wide-band information signals to said further balanced modulator means in respective predetermined amplitude and phase; and further means for combining output signals from said third path with the output signals from the first and second paths to compensate for nonlinearities in the modulator arrangement and its output path.

5. The wide-band modulator arrangement in accordance with claim 4, wherein the combined signals from said first and second paths are arranged to be amplified before the signals from the third path are combined therewith.

* * * * *